United States Patent [19]
Bazarjani et al.

[11] Patent Number: 6,005,506
[45] Date of Patent: Dec. 21, 1999

[54] RECEIVER WITH SIGMA-DELTA ANALOG-TO-DIGITAL CONVERTER FOR SAMPLING A RECEIVED SIGNAL

[75] Inventors: Seyfollah S. Bazarjani, San Diego; Steven C. Ciccarelli, Encinitas; Saed G. Younis; Daniel K. Butterfield, both of San Diego, all of Calif.

[73] Assignee: Qualcomm, Incorporated, San Diego, Calif.

[21] Appl. No.: 08/987,306

[22] Filed: Dec. 9, 1997

[51] Int. Cl.$^6$ .............................. H03M 3/00; H03D 3/00; H03K 9/06
[52] U.S. Cl. ............................................ 341/143; 375/322
[58] Field of Search ...................................... 341/143, 155; 375/279, 280, 261, 329, 332, 340, 316, 322; 329/356

[56] References Cited

U.S. PATENT DOCUMENTS

| | | | |
|---|---|---|---|
| 4,857,928 | 8/1989 | Gailus et al. | 341/143 |
| 4,857,938 | 8/1989 | Gailus et al. | 341/143 |

(List continued on next page.)

FOREIGN PATENT DOCUMENTS

| | | | |
|---|---|---|---|
| 0643477 | 9/1994 | European Pat. Off. | H03D 7/16 |
| 0673125 | 9/1994 | European Pat. Off. | H04B 1/707 |
| 0641085 | 3/1995 | European Pat. Off. | H03M 3/032 |
| 0814568 | 12/1997 | European Pat. Off. | H04B 1/10 |
| 2258122 | 7/1992 | United Kingdom | H04B 1/10 |
| 9307679 | 4/1993 | WIPO | H03M 3/00 |
| 9619048 | 6/1996 | WIPO | H04B 7/005 |
| 9624193 | 8/1996 | WIPO | H03M 1/18 |

OTHER PUBLICATIONS

"A Comparison of Modulator Networks for High Order Oversampled ΣΔ Analog–to Digital Converters" Ribner, IEEE Transactions on Circuits and Systems, vol. 38 No. 2, Feb. 1991.

"A High Frequency and High Resolution Fourth Order ΣΔ A/D Converter in BiCMOS Technologyu", Yin et al., IEEE Journal on Solid State Circuits, vol. 29, No. 8 Aug. 1994.

"An 81–MHz IF Receiver in CMOS", Hairapetian, IEEE Journal on Solid State Circuits, vol. 31, No. 12, pp. 1981–1986, Dec. 1996.

"Low Voltage Double Sampled ΣΔ Converters", Senderowicz et al., IEEE Journal on Solid State Circuits, vol. 32, No. 12, Dec. 1997.

"A Novel Double Sampling Technique for Delta–Sigma Modulators", Yang et al., Dept. of Electrical Engineering Technical University of Nova Scotia, published Mar. 08, 1994 (4pgs).

(List continued on next page.)

*Primary Examiner*—Michael Tokar
*Assistant Examiner*—Patrick Wamsley
*Attorney, Agent, or Firm*—Russell B. Miller; Sean English; Brian S. Edmonston

[57] ABSTRACT

A receiver comprising a sigma-delta analog-to-digital converter (ΣΔ ADC) can be utilized in one of four configurations, as a subsampling bandpass receiver, a subsampling baseband receiver, a Nyquist sampling bandpass receiver, or a Nyquist sampling baseband receiver. For subsampling ΣΔ receivers, the sampling frequency is less than twice the center frequency of the input signal into the ΣΔ ADC. For Nyquist sampling ΣΔ receivers, the sampling frequency is at least twice the highest frequency of the input signal into the ΣΔ ADC. For baseband ΣΔ receivers, the center frequency of the output signal from the ΣΔ ADC is approximately zero or DC. For bandpass ΣΔ receivers, the center frequency of the output signal from the ΣΔ ADC is greater than zero. The sampling frequency can be selected based on the bandwidth of the input signal to simplify the design of the digital circuits used to process the output samples from the ΣΔ ADC. Furthermore, the center frequency of the input signal can be selected based on the sampling frequency and the bandwidth of the input signal. The ΣΔ ADC within the receiver provides many benefits.

38 Claims, 6 Drawing Sheets

U.S. PATENT DOCUMENTS

| | | | |
|---|---|---|---|
| 5,001,725 | 3/1991 | Senderowicz et al. | 375/547 |
| 5,283,578 | 2/1994 | Ribner et al. | 341/143 |
| 5,311,181 | 5/1994 | Ferguson, Jr. et al. | 341/143 |
| 5,345,406 | 9/1994 | Williams | 364/724 |
| 5,430,890 | 7/1995 | Vogt et al. | 455/180.3 |
| 5,432,779 | 7/1995 | Shimo et al. | 370/30 |
| 5,442,353 | 8/1995 | Jackson | 341/143 |
| 5,477,481 | 12/1995 | Kerth | 364/825 |
| 5,500,645 | 3/1996 | Ribner et al. | 341/143 |
| 5,517,689 | 5/1996 | Hayashihara | 455/205 |
| 5,550,869 | 8/1996 | Gurantz et al. | 375/340 |
| 5,557,642 | 9/1996 | Willams | 375/316 |
| 5,568,144 | 10/1996 | Chiao et al. | 341/139 |
| 5,574,457 | 11/1996 | Garrity et al. | 341/172 |
| 5,590,411 | 12/1996 | Sroka et al. | 455/78 |
| 5,621,345 | 4/1997 | Lee et al. | 327/254 |
| 5,623,432 | 4/1997 | Degrauwe | 364/707 |
| 5,729,230 | 3/1998 | Jensen et al. | 341/143 |
| 5,734,683 | 3/1998 | Hulkko et al. | 375/316 |
| 5,764,171 | 6/1998 | Stikvoort | 341/143 |

OTHER PUBLICATIONS

"A 40 MHz IF Fourth–Order Double Sampled SC Bandpass ΣΔ Modulator", Bazarjani et al., IEEE Int'l Symposium on Circuits and Systems, Jun. 9–12, 1997 Hong Kong, pp. 73–76.

"A Third Order Sigma Delta Modulator with Extended Dynamic Range", Williams et al., IEEE Journal on Solid State Circuits, vol. 29, Mar 1994.

PhD Thesis of Seyfi Bazarjani entitled "Mixed Analog–Digital Design Considerations in Deep Submicron CMOS Tehnologies" presented Jul. 24, 1996 to Ottawa Carleton Institute for Electrical Engineering.

RECEIVER WITH SIGMA-DELTA ANALOG-TO-DIGITAL CONVERTER FOR SAMPLING A RECEIVED SIGNAL

BACKGROUND OF THE INVENTION

I. Field of the Invention

The present invention relates to communications. More particularly, the present invention relates to a novel and improved receiver comprising a sigma-delta analog-to-digital converter.

II. Description of the Related Art

In many modern communication systems, digital transmission is utilized because of the improved efficiency and the ability to detect and correct transmission errors. Exemplary digital transmission formats include binary phase shift keying (BPSK), quaternary phase shift keying (QPSK), offset quaternary phase shift keying (OQPSK), m-ary phase shift keying (m-PSK), and quadrature amplitude modulation (QAM). Exemplary communication systems which utilize digital transmission include code division multiple access (CDMA) communication systems and high definition television (HDTV) systems. The use of CDMA techniques in a multiple access communication system is disclosed in U.S. Pat. No. 4,901,307, entitled "SPREAD SPECTRUM MULTIPLE ACCESS COMMUNICATION SYSTEM USING SATELLITE OR TERRESTRIAL REPEATERS", and U.S. Pat. No. 5,103,459, entitled "SYSTEM AND METHOD FOR GENERATING WAVEFORMS IN A CDMA CELLULAR TELEPHONE SYSTEM", both assigned to the assignee of the present invention and incorporated by reference herein. An exemplary HDTV system is disclosed in U.S. Pat. No. 5,452,104, U.S. Pat. No. 5,107,345, and U.S. Pat. No. 5,021,891, all three entitled "ADAPTIVE BLOCK SIZE IMAGE COMPRESSION METHOD AND SYSTEM", and U.S. Pat. No. 5,576,767, entitled "INTERFRAME VIDEO ENCODING AND DECODING SYSTEM", all four patents are assigned to the assignee of the present invention and incorporated by reference herein.

In the CDMA system, a base station communicates with one or more remote stations. The base station is typically located at a fixed location. Therefore, power consumption is less important consideration in the design of the base station. The remote stations are typically consumer units which exist in high quantity. Therefore, cost and reliability are important design considerations because of the number of units produced. Furthermore, in some applications such as a CDMA mobile communication system, power consumption is critical because of the portable nature of the remote station. Tradeoffs between performance, cost, and power consumption are usually made in the design of the remote stations.

In digital transmission, the digitized data is used to modulate a carrier sinusoid using one of the formats listed above. The modulated waveform is further processed (e.g. filtered, amplified, and upconverted) and transmitted to the remote station. At the remote station, the transmitted RF signal is received and demodulated by a receiver.

A block diagram of an exemplary super-heterodyne receiver 2100 of the prior art which is used for quadrature demodulation of QSPK, OQPSK, and QAM signal is illustrated in FIG. 1. Receiver 2100 can be used at the base station or the remote station. Within receiver 2100, the transmitted RF signal is received by antenna 2112, routed through duplexer 2114, and provided to front end 2102. Within front end 2102, amplifier (AMP) 2116 amplifies the signal and provides the signal to bandpass filter 2118 which filters the signal to remove undesired signals. As used in this specification, undesired signals comprise noise, spurious signals, undesirable images, interference, and jammers. The filtered RF signal is provided to mixer 2120 which downconverts the signal to a fixed intermediate frequency (IF) with the sinusoid from local oscillator (LO1) 2122. The IF signal from mixer 2120 is filtered by bandpass filter 2124 and amplified by automatic gain control (AGC) amplifier 2126 to produce the required signal amplitude at the input of analog-to-digital-converters (ADCs) 2140. The gain controlled signal is provided to demodulator 2104. Within demodulator 2104, two mixers 2128a and 2128b downconvert the signal into the baseband I and Q signals with the sinusoid provided by local oscillator (LO2) 2134 and phase shifter 2136, respectively. The baseband I and Q signals are provided to lowpass filters 2130a and 2130b, respectively, which provide match filtering, adjacent channel rejection, and/or anti-alias filtering of the baseband signals. The filtered signals are provided to ADCs 2140a and 2140b which sample the signals to produce the digitized baseband samples. The samples are provided to baseband processor 2150 for further processing (e.g. error detection, error correction, and decompression) to produce reconstructed estimates of the transmitted data.

The first frequency downconversion with mixer 2120 allows receiver 2100 to downconvert signals at various RF frequencies to a fixed IF frequency where more signal processing can be performed. The fixed IF frequency allows bandpass filter 2124 to be implemented as a fixed bandpass filter, such as a surface acoustic wave (SAW) filter, to remove undesired signals from the IF signal. Removal of undesired signals is important since these signals can fold into the signal band (e.g. the band where the input signal is present) at the second frequency downconversion stage. Furthermore, the undesired signals can significantly increase the amplitude of the signal into various active components, such as the amplifiers and mixers, which can cause higher level of intermodulation products from the non-linearity in the active components. Undesired signals and intermodulation products can cause degradation in the performance of the communication system.

The quadrature demodulator of the prior art has several major drawbacks. First, the required filtering by bandpass filter 2124 and/or lowpass filters 2130 can be complex. These filters may require a flat passband, high attenuation in the stopband, and sharp roll-off in the transition band. These filters are implemented with analog circuits. Component tolerance of analog circuits is difficult to maintain and can cause distortion in the frequency response of these filters. The performance of receiver 2100 can be degraded as the result of the distortion. Second, quadrature balance is difficult to maintain over many production units because of component tolerance in phase splitter 2136, mixers 2128, lowpass filter 2130, and ADCs 2140. Any mismatch in the two signal paths results in quadrature imbalance and degradation in the performance of receiver 2100. Path mismatch results in cross-talk of the I signal onto the Q signal, and vice versa. The cross-talk signal behaves as additive noise in the desired signal and results in poor detection of the desired signal. Third, the prior art receiver architecture has DC offset because the analog filters are at baseband. And fourth, ADCs 2140 can cause degradation in the performance of receiver 2100 for various reasons described below.

In most demodulators, one or more ADCs are required to convert an analog waveform in continuous time into discrete samples at evenly spaced time intervals. Some important performance parameters of an ADC include dynamic range, linearity, and DC offset. Each of these parameters can affect the performance of the communication system. Dynamic range can affect the bit-error-rate (BER) performance of the receiver because the noise from the ADC degrades the ability of the ADC to properly detect the input signal. Linearity relates to the difference between an actual transfer curve (e.g. digital output versus analog input) and the ideal transfer curve. Good linearity is more difficult to obtain as the number of bits in the ADC increases. Poor linearity can degrade the error detection/correction process. And DC offset can degrade the performance of the phase locked loop in the receiver and of the error correcting decoder, such as the Viterbi decoder.

In the prior art, flash ADCs or successive approximation ADCs are used to sample the baseband signals. Within the flash ADC, the input signal is divided by a resistive ladder to produce L-1 comparison signals, where $L=2^m$ and m is the number of bits in the ADC. The comparison signals are compared against L-1 reference voltages, which are generated by a second resistive ladder, by L-1 comparators. Flash ADCs are bulky and consume high power because L-1 comparators and 2L resistors are required. Flash ADCs can have poor linearity and poor DC offset characteristics if the resistors in the resistive ladder are not matched. However, flash ADCs are popular because of their high operating speed.

Successive approximation ADCs are also popular for communication systems. These ADCs minimize complexity by performing approximations of the input signal over two or more stages. However, these ADCs can also exhibit poor linearity and poor DC offset characteristics similar to those of the flash ADCs. Thus, flash ADCs and successive approximation ADCs are not ideal candidates for use in many communication applications.

Sigma delta analog-to-digital converters ($\Sigma\Delta$ ADCs) have better performance than flash and successive approximation ADCs because of the inherent architecture of the $\Sigma\Delta$ ADC. $\Sigma\Delta$ ADC performs analog-to-digital conversion of the input signal by making successive one-bit approximations of the input signal at a sampling frequency which is many times higher than the bandwidth of the input signal. The output samples comprise the input signal and the quantization noise. However, the $\Sigma\Delta$ ADC can be designed such that the quantization noise in the signal band (e.g. the band where the signal is present) is pushed to out-of-band frequency (or noise shaped) where filtering is more easily performed. The out-of-band quantization noise is normally not an additional concern because filtering is typically provided in communication devices to remove undesired signals, such as jammers.

$\Sigma\Delta$ ADC can provide high dynamic range, good linearity, and low DC offset because of the inherent structure of the $\Sigma\Delta$ ADC. For example, high dynamic range can be obtained by selecting a sufficient oversampling ratio (OSR) and the proper noise shaping filter characteristic. For bandpass sampling, the oversampling ratio is defined as the sampling frequency divided by the two-sided bandwidth of the input. Additionally, good linearity can be obtained because of the simple one-bit quantizer within the $\Sigma\Delta$ ADC. For bandpass sampling $\Sigma\Delta$ ADC, DC offset is still present but is located away from the desired signal.

Because a high oversampling ratio is required for high performance, $\Sigma\Delta$ ADCs have been traditionally limited to applications where the input signal is a low bandwidth signal, such as audio application. However, with the advent of high speed analog circuits, $\Sigma\Delta$ ADCs can be implemented to operate at high speed. High speed bandpass and baseband $\Sigma\Delta$ ADC designs and implementations are disclosed in detail in copending U.S. patent application Ser. No. 08/928,874 entitled "BANDPASS SIGMA-DELTA ANALOG-TO-DIGITAL CONVERTER", filed Sep. 12, 1997, assigned to the assignee of the present invention and incorporated by reference herein.

SUMMARY OF THE INVENTION

The present invention is a novel and improved receiver which comprises a sigma-delta analog-to-digital converter ($\Sigma\Delta$ ADC). The present invention can be utilized in one of four configurations, as a subsampling bandpass receiver, a subsampling baseband receiver, a Nyquist sampling bandpass receiver, or a Nyquist sampling baseband receiver. For subsampling $\Sigma\Delta$ receivers, the sampling frequency is less than twice the center frequency of the input signal to the $\Sigma\Delta$ ADC. For Nyquist sampling $\Sigma\Delta$ receivers, the sampling frequency is at least twice the highest frequency of the input signal to the $\Sigma\Delta$ ADC. For baseband $\Sigma\Delta$ receivers, the center frequency of the output signal from the $\Sigma\Delta$ ADC is approximately zero or DC. For bandpass $\Sigma\Delta$ receivers, the center frequency of the output signal from the $\Sigma\Delta$ ADC is greater than zero. Preferably, for bandpass $\Sigma\Delta$ receivers, the center frequency of the input signal into the $\Sigma\Delta$ ADC is placed such that the center frequency of the output signal from the $\Sigma\Delta$ ADC is approximately $0.25 \cdot f_s$, where $f_s$ is the sampling frequency of the $\Sigma\Delta$ ADC. This $0.25 \cdot f_s$ center frequency simplifies the inphase and quadrature separation and provides the maximum separation between the aliases, but is not a necessary requirement. The sampling frequency can further be selected based on the bandwidth of the input signal to simplify the design of the digital circuits used to process the output samples from the $\Sigma\Delta$ ADC. Furthermore, the center frequency of the input signal can be selected based on the sampling frequency and the bandwidth of the input signal.

It is an object of the present invention to provide a subsampling $\Sigma\Delta$ receiver for demodulation of digital and analog modulation formats. The use of a subsampling $\Sigma\Delta$ ADC within the receiver provides many benefits including (1) elimination of an analog frequency downconversion stage which is provided for by subsampling of the input signal and the aliasing property of sampling, (2) reduction of the analog filtering requirements by clocking the $\Sigma\Delta$ ADC at a high oversampling ratio and designing the $\Sigma\Delta$ ADC with additional bits of resolution which can be used to handle undesired signals, (3) improvement in reliability and increase in flexibility by the use of digital demodulation for the output samples from the $\Sigma\Delta$ ADC, (4) elimination of quadrature imbalance by designing the digital circuits to have the requisite quadrature balance, (5) improvement in dynamic range, linearity, and DC offset by the use of a $\Sigma\Delta$ ADC, and (6) reduction in power consumption.

It is another object of the present invention to provide a Nyquist sampling $\Sigma\Delta$ receiver for demodulation of digital and analog modulation formats. The use of the Nyquist sampling $\Sigma\Delta$ ADC provides many benefits such as improved dynamic range, increased linearity, reduced DC offset, and minimum power consumption.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
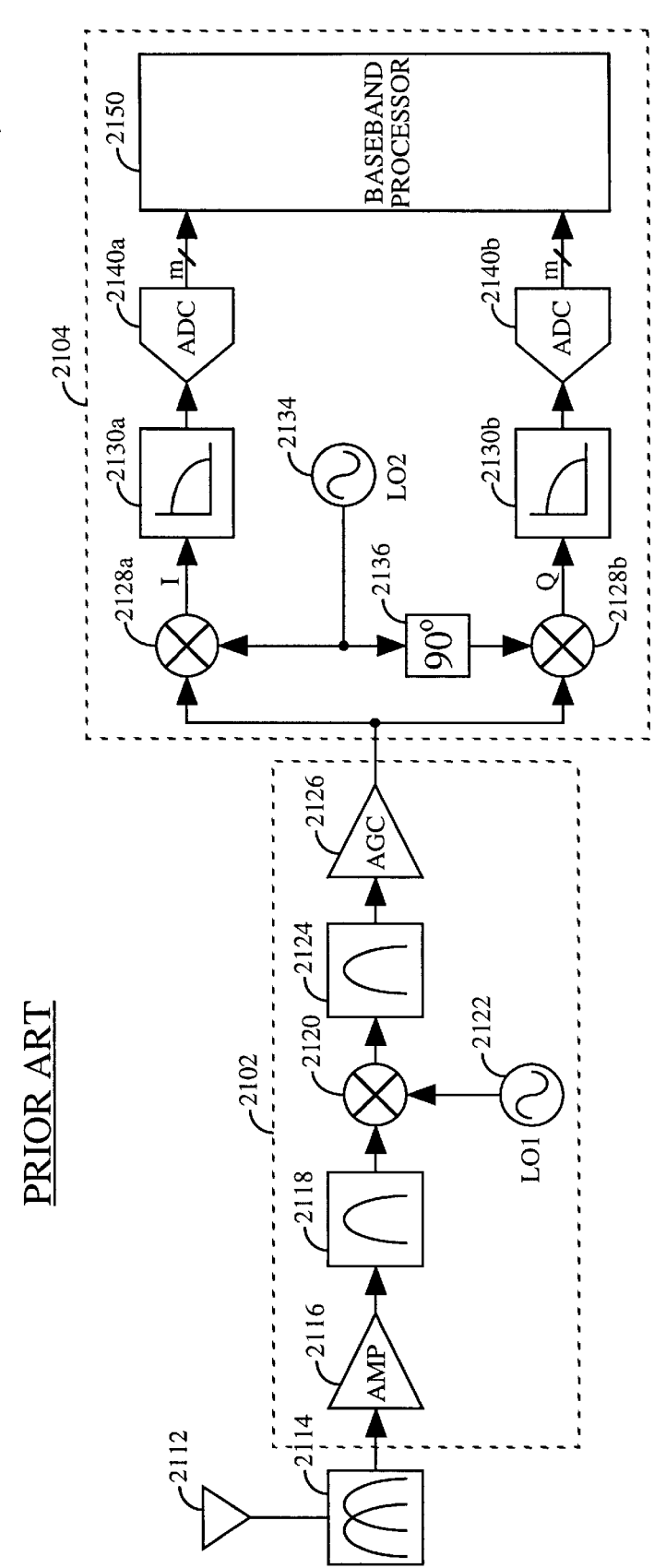
FIG. 1 is a block diagram of an exemplary superheterodyne receiver of the prior art.

The present invention utilizes the superior performance of a high speed sigma-delta analog-to-digital converter (ΣΔ ADC) to perform the required analog-to-digital conversion of an analog waveform. Exemplary applications include CDMA communication systems and HDTV signals. In the subsampling ΣΔ receiver embodiment of the present invention, the input signal is centered at an intermediate frequency (IF) instead of baseband. As used in this specification, subsampling denotes that the sampling frequency of the ΣΔ ADC is less than twice the center frequency of the input signal into the ΣΔ ADC. Sampling at of a signal located at an IF frequency allows for the elimination of a frequency downconversion stage in the receiver, thus simplifying the hardware design and improving reliability. The noise shaper within the ΣΔ ADC can be designed such that the quantization noise around the signal band is pushed out-of-band (or noise shaped) where filtering is more easily performed. For subsampling ΣΔ receivers, the ΣΔ ADC can be a bandpass ΣΔ ADC or a baseband ΣΔ ADC, depending on the application and the requirements. As used in this specification, baseband sampling (or baseband ΣΔ ADC) denotes that the output signal from the ΣΔ ADC is centered at approximately zero or DC and bandpass sampling (or bandpass ΣΔ ADC) denotes that the output signal from the ΣΔ ADC is centered at greater than DC. The use of ΣΔ ADC provides many advantages over conventional (e.g. flash and successive approximation) ADCs as described below. In the Nyquist sampling ΣΔ receiver embodiment of the present invention, the input signal can be at baseband or an IF frequency and a baseband or a bandpass ΣΔ ADC can be used to sample the input signal, respectively. As used in this specification, Nyquist sampling denotes that the sampling frequency of the ΣΔ ADC is at least twice the highest frequency of the input signal into the ΣΔ ADC.

The ΣΔ ADC samples an analog waveform in continuous time to provide discrete samples at evenly spaced intervals. The ΣΔ ADC has the following transfer function:

$$Y(z)=STF(z)\cdot X(z)+NTF(z)\cdot E(z), \quad (1)$$

where $Y(z)$ is the output from the ADC in the z-transform domain, $X(z)$ is the input to the ADC, $STF(z)$ is the signal transfer function from the input to the output of the ADC, $E(z)$ is the quantization noise, and $NTF(z)$ is the noise transfer function from the quantizer to the output of the ADC. Thus, the ADC output $Y(z)$ comprises the input signal $X(z)$ which is shaped by the signal transfer function $STF(z)$ plus the quantization noise $E(z)$ which is shaped by the noise transfer function $NTF(z)$. To avoid distortion of the input signal $X(z)$, the signal transfer function $STF(z)$ is typically designed such that, within the desired degree of required accuracy, it is frequency independent in the band of interest. For example, $STF(z)$ can be an alipass function comprising a fixed gain ($A_1$) and delay elements ($z^{-1}$), such as $A_1 \cdot z^{-k}$. The quantization noise $E(z)$ can be shaped by the noise transfer function $NTF(z)$ such that the quantization noise in the signal band is pushed out-of-band where filtering is more easily performed. The characteristics of the noise transfer function $NTF(z)$ is selected based on the application for which the ADC is used and is designed to provide the required performance.

I. Subsampling ΣΔ Receiver

Figure 2:
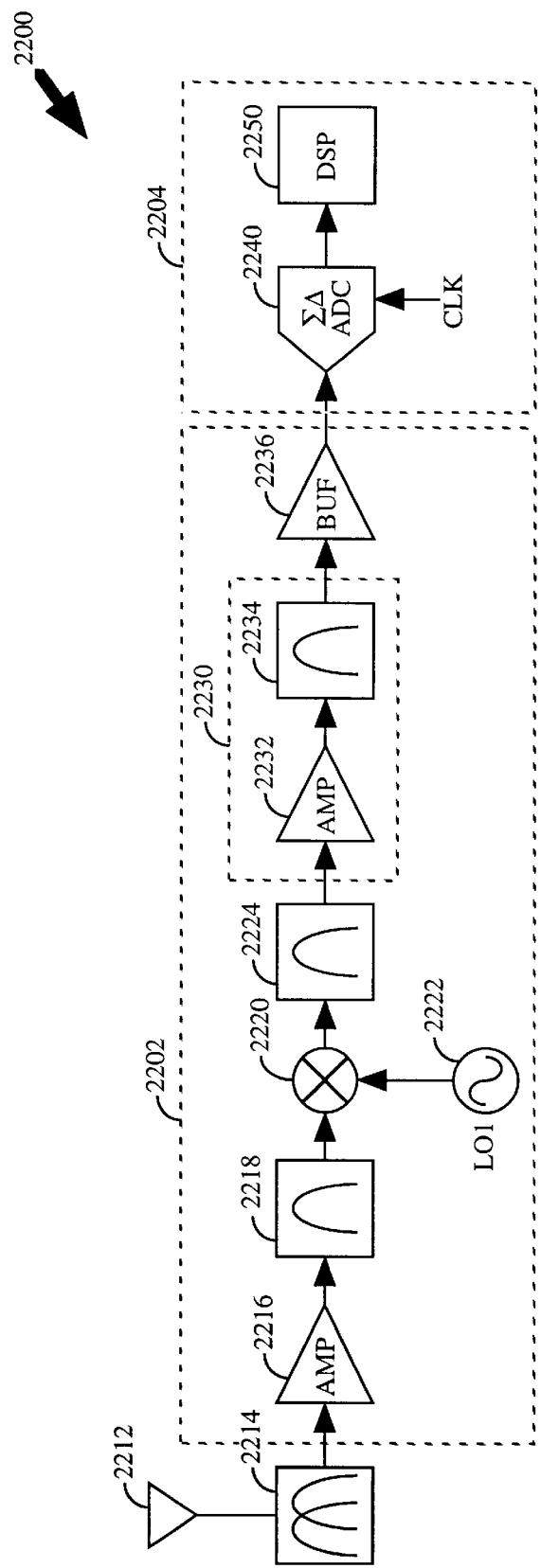
FIG. 2 is a block diagram of an exemplary subsampling ΣΔ receiver of the present invention.

A block diagram of an exemplary subsampling ΣΔ receiver is illustrated in FIG. 2. Receiver 2200 can be used to demodulate BPSK, QPSK, OQPSK, QAM, and other digital and analog modulation formats. Within receiver 2200, the transmitted signal is received by antenna 2212, routed through duplexer 2214, and provided to front end 2202. Within front end 2202, amplifier (AMP) 2216 amplifies the signal and provides the amplified signal to bandpass filter 2218 which filters the signal to remove undesired signals. In the exemplary embodiment, bandpass filter 2218 is a surface acoustic wave (SAW) filter, the implementation of which is known in the art. The filtered signal is provided to mixer 2220 which downconverts the signal with the sinusoid from local oscillator (LO1) 2222. The IF signal from mixer 2220 is provided to bandpass filter 2224 which further filters the signal. In the exemplary embodiment, bandpass filter 2224 is another SAW filter which removes undesired signals which will alias into the band of interest and reduces the required dynamic range by filtering the jammers.

In some applications, such as a CDMA communication system operating at the personal communication system (PCS) band, the filtered signal from bandpass filter 2224 is provided to IF processor 2230. Within IF processor 2230, the filtered signal is amplified by amplifier 2232 and filtered by bandpass filter 2234 to further remove undesired signals. Bandpass filter 2234 is included to provide further anti-alias filtering. The filtered signal is provided to buffer (BUF) 2236 which provides gain and/or buffering of the signal. In other applications, such as the CDMA communication system operating at the 900 MHz cellular band, the gain and filtering provided by IF processor 2230 is not necessary. In this case, the signal from bandpass filter 2224 is provided directly to buffer 2236. The buffered signal is provided to demodulator 2204. Within demodulator 2204, ΣΔ ADC 2240 samples the buffered signal at a high sampling frequency determined by the CLK signal and provides the samples to digital signal processor (DSP) 2250. Digital signal processor 2250 is described in detail below.

Receiver 2200 comprises the basic functionalities required by most receivers. However, the arrangement of amplifiers 2216 and 2232, bandpass filters 2218, 2224, and 2234, and mixer 2220 can be reordered to optimize the performance of receiver 2200 for specific applications. For example, bandpass filter 2218 can be interposed between duplexer 2214 and amplifier 2216 to filter out undesired signals before the first amplifier stage. Amplifier 2216 can replaced with a low noise amplifier (LNA) or an automatic gain control (AGC) amplifier to provide the required gain and AGC control. Additional frequency downconversion stages can also be added within receiver 2200 as required. Different arrangements of the functionalities shown herein can be contemplated and are within the scope of the present invention. Furthermore, other arrangements of the functionalities shown herein in combination with other receiver functionalities which are known in the art can also be contemplated and are within the scope of the present invention.

Figure 3:
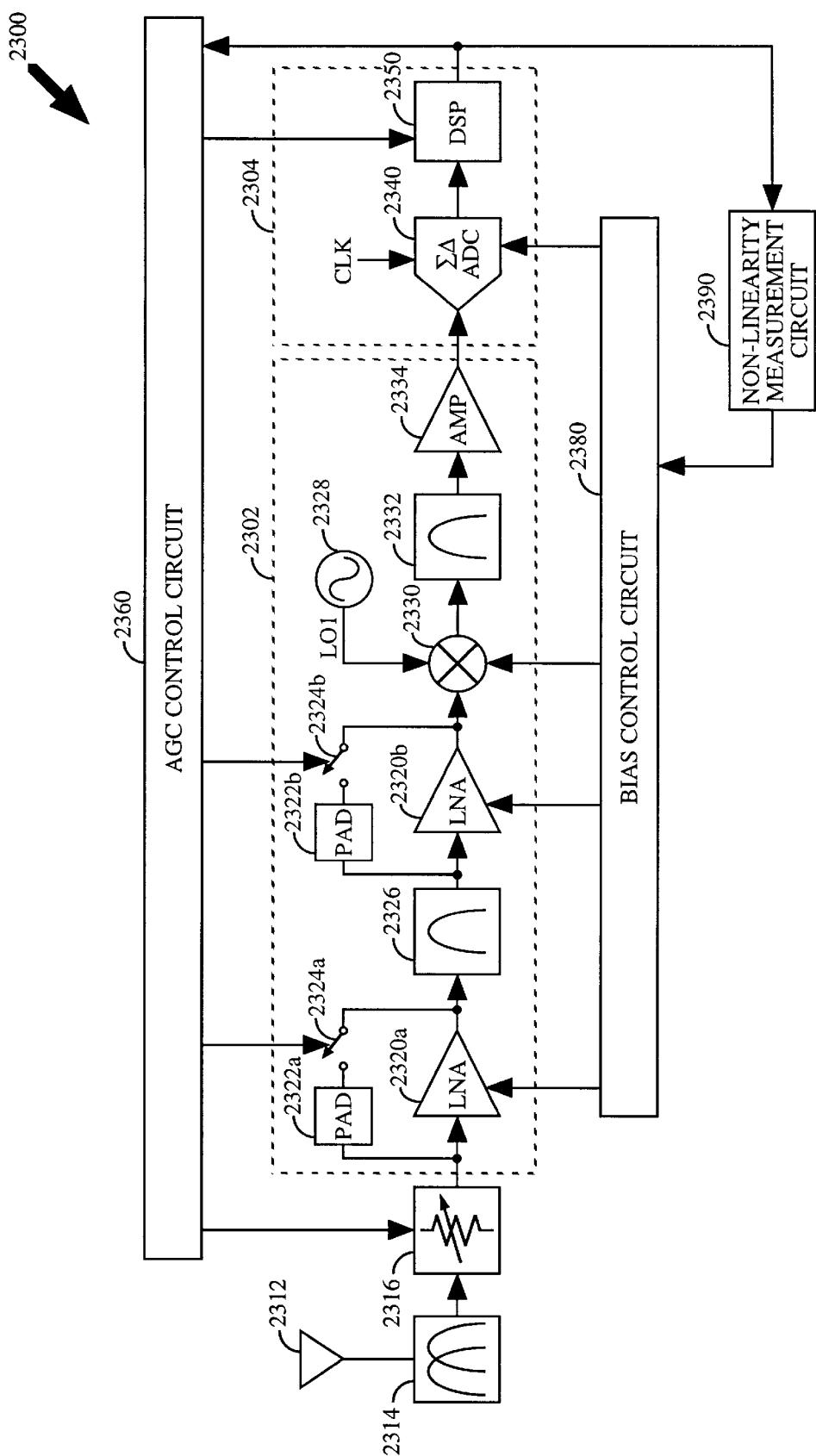
FIG. 3 is a block diagram of an exemplary alternative subsampling ΣΔ receiver of the present invention.

A block diagram of an alternative subsampling ΣΔ receiver of the present invention is illustrated in FIG. 3. Receiver 2300 provides the benefits of subsampling ΣΔ receiver 2200 in addition to the benefits of a programmable linear receiver as disclosed in copending U.S. patent application Ser. No. 08/987,305. Within receiver 2300, the transmitted RF signal is received by antenna 2312, routed through duplexer 2314, and provided to attenuator 2316. Attenuator 2316 attenuates the RF signal to provide a signal at the required amplitude and provides the attenuated signal to front end 2302. Within front end 2302, the attenuated signal is provided to pad 2322a and low noise amplifier (LNA) 2320a. LNA 2320a amplifies the RF signal and provides the amplified signal to bandpass filter 2326. Pad 2322a provides a predetermined level of attenuation and connects in series with switch 2324a. Switch 2324a provides a bypass route around LNA 2320a when the gain of LNA 2320a is not required. Bandpass filter 2326 filters the signal to remove undesired signals which can cause intermodulation products in the subsequent signal processing stages. The filtered signal is provided to pad 2322b and low noise amplifier (LNA) 2320b. LNA 2320b amplifies the filtered signal and provides the signal to mixer 2330. Pad 2322b provides a predetermined level of attenuation and connects in series with switch 2324b. Switch 2324b provides a bypass route around LNA 2320b when the gain of LNA 2320b is not required. Mixer 2330 downconverts the signal to an IF frequency with the sinusoid from local oscillator (LO1) 2328. The IF signal is provided to bandpass filter 2332 which filters out undesired signals and out-of-band downconversion products. The filtered IF signal is provided to amplifier (AMP) 2334 which amplifies the signal. The amplified IF signal is provided to demodulator 2304 which demodulates the signal in accordance with the modulation format used at the transmitter. Demodulator 2304 is identical to demodulator 2204 (see FIG. 2) which is described below. In this and similar receiver designs, some of the gain control (or some AGC range) can be provided by amplifier 2334 which can be implemented as a voltage control amplifier (VGA), digital signal processor (DSP) 2350 within demodulator 2304, the reference voltage within ΣΔ ADC 2340, or combinations of the above.

For applications wherein quadrature demodulation is required, such as QPSK, OQPSK, and QAM, a bandpass ΣΔ ADC is utilized. The bandpass ΣΔ ADC can be designed and implemented in the manner described in copending U.S. patent application Ser. No. 08/928,874. The bandpass ΣΔ ADC samples the IF signal from amplifier 2334 and provides the IF samples to digital signal processor 2250.

Figure 4:
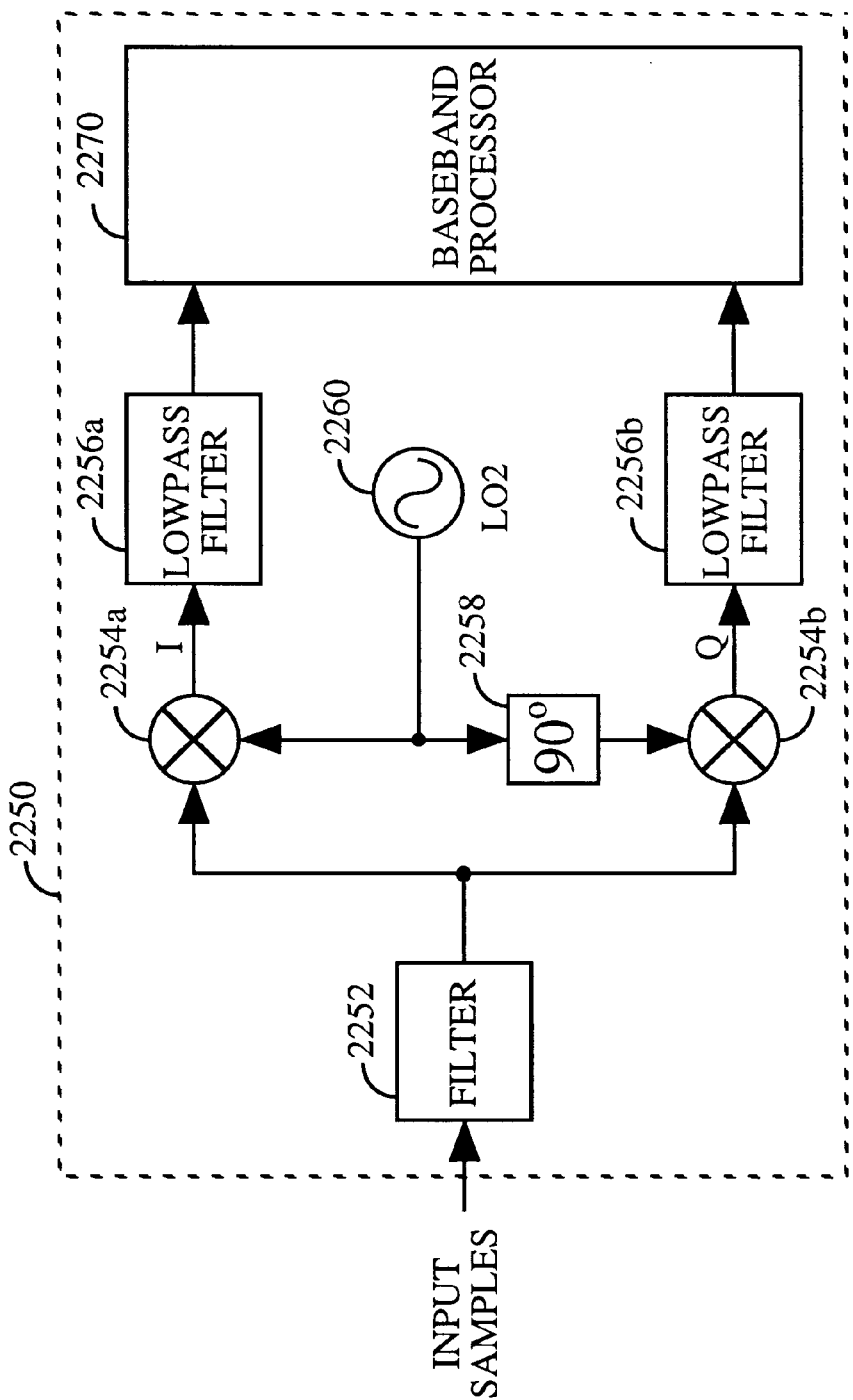
FIG. 4 is a block diagram of an exemplary digital signal processor of the present invention which is used for quadrature demodulation.

An exemplary block diagram of digital signal processor 2250 used for quadrature demodulation is illustrated in FIG. 4. The quantized IF samples from ΣΔ ADC 2240 are provided to filter 2252 which filters and decimates the IF samples. The filtered samples are provided to multipliers 2254a and 2254b which downconvert the filtered samples to the baseband I and Q samples with the inphase and quadrature sinusoids from local oscillator (LO2) 2560 and phase shifter 2258, respectively. Phase shifter 2258 provides 90° of phase shift for the quadrature sinusoid. The baseband I and Q samples are provided to lowpass filters 2256a and 225b, respectively, which filters the samples to provide the I and Q data. The I and Q data are provided to baseband processor 2270 which performs additional signal processing, such as error detection/correction and decompression. In the exemplary embodiment, filter 2252 and/or lowpass filters 2256 also provide scaling of the samples to enable digital signal processor 2250 to provide baseband data at various amplitude. Other implementations of digital signal processor 2250 can be designed to performed quadrature demodulation and are within the scope of the present invention.

For applications wherein quadrature demodulation is not required, such as BPSK and FM, a baseband ΣΔ ADC can be used. The baseband ΣΔ ADC can be designed and implemented in the manner described in copending U.S. patent application Ser. No. 08/928,874. For subsampling baseband ΣΔ receiver, the IF signal is placed at $f_{IF}=n \cdot f_s$, where n is an integer greater than one. This IF frequency results in an image of the desired signal at DC.

Subsampling ΣΔ receivers, such as receivers 2200 and 2300, have many advantages over the super-heterodyne receiver 2100 of the prior art. First, the second analog frequency downconversion stage (e.g. mixers 2128 in FIG. 1) is completely eliminated by utilizing subsampling ΣΔ receivers. Second, subsampling ΣΔ receivers require less stringent anti-alias analog filtering because of the high oversampling ratio and high dynamic range of the ΣΔ ADC. These characteristics allows the bulk of the filtering function to be moved to the subsequent digital filters. Third, the digital signal processing after the ΣΔ ADC can be performed with the required precision and with improved reliability over the analog processing of the prior art. Fourth, digital demodulation of the IF samples removes the quadrature imbalance which is common with the super-heterodyne receiver 2100 of the prior art. And fifth, the ΣΔ ADC of the present invention can provide improved dynamic range, linearity, and DC offset over the conventional ADCs used in the prior art. These advantages are discussed in detail below.

Figure 5A:
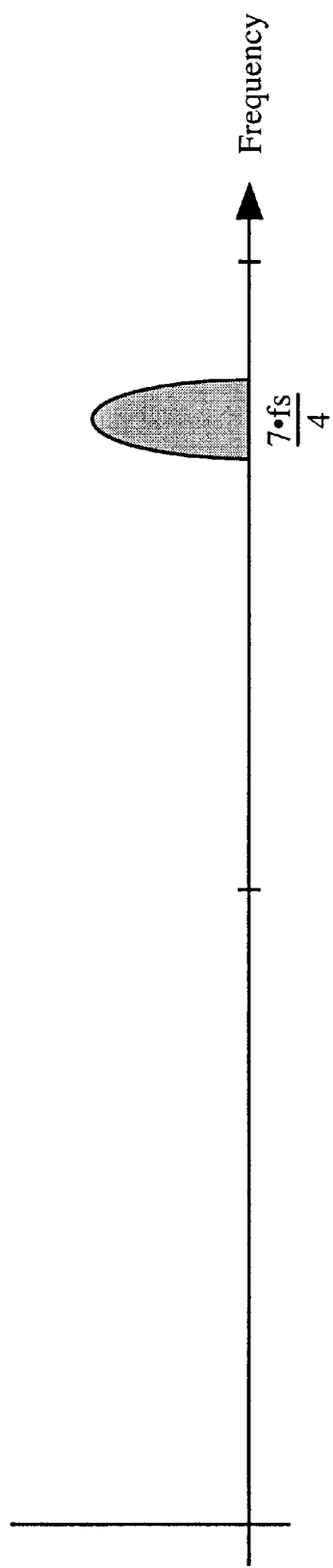
FIGS. 5A–5B are diagrams of the frequency spectrum of the IF input and the frequency spectrum of the output samples from the ΣΔ ADC for a subsampling bandpass ΣΔ receiver, respectively.
Figure 5B:
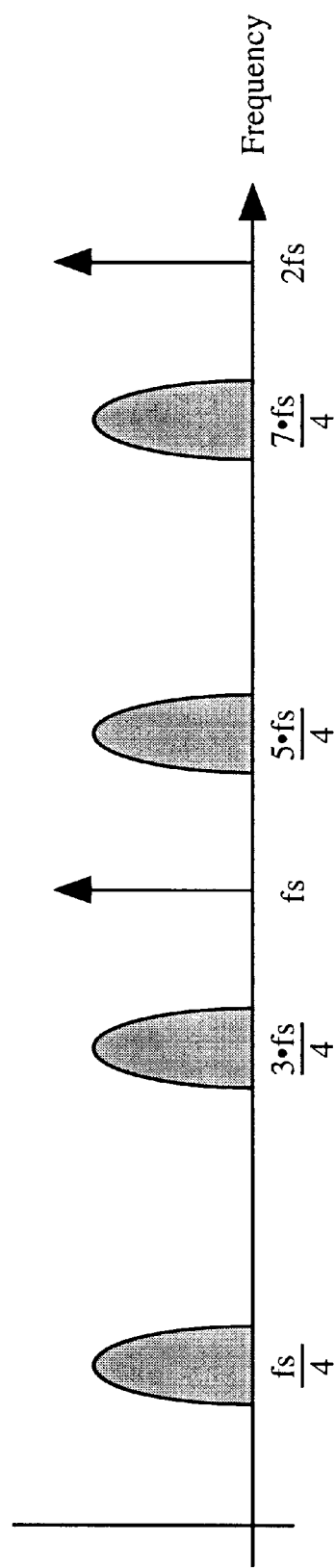

The first major advantage of the subsampling ΣΔ receivers of the present invention is the elimination of an analog frequency downconversion stage. The diagrams of the frequency spectrum of the IF input and the frequency spectrum of the IF samples from the ΣΔ ADC for a subsampling bandpass ΣΔ receiver are illustrated in FIGS. 5A–5B, respectively. For subsampling bandpass ΣΔ receiver, the IF signal is placed at $f_{IF}=0.25 \cdot (2n+1)f_s$, where n is an integer greater than one and $f_s$ is the sampling frequency of the ΣΔ ADC. In the exemplary embodiment, n is equal to three and the frequency of the IF signal into the ΣΔ ADC is centered at $f_{IF}=1.75 \cdot f_s$. The center frequency of the IF signal can be controlled by changing the frequency of the local oscillator within the front end (e.g. local oscillator 2222 in FIG. 2). When the IF signal is sampled at an undersampling frequency, the IF signal aliases and images of the IF signal appear at $0.25 \cdot f_s$, $0.75 \cdot f_s$, $1.25 \cdot f_s$, $1.75 \cdot f_s$ and so on (see FIG. 5B). Undersampling denotes that the sampling frequency is less than twice the highest frequency of the IF signal. Using the aliasing property of sampling, the IF signal at $1.75 \cdot f_s$ is effectively downconverted to $0.25 \cdot f_s$ without the use of an analog downconversion stage. The signal at $0.25 \cdot f_s$ is subsequently processed by the digital signal processor.

For subsampling bandpass ΣΔ receivers, the ΣΔ ADC is a bandpass ΣΔ ADC which shapes the quantization noise in the manner as disclosed in copending U.S. patent application Ser. No. 08/928,874. For a bandpass ΣΔ ADC, the quantization noise around $0.25 \cdot f_s$ is pushed to DC and $0.50 \cdot f_s$ where filtering of the quantization noise is more easily performed. In the exemplary embodiment, the center frequency of the IF signal is selected such that an image appears at 0.25·$f_s$, the frequency where the quantization noise is minimal.

For quadrature demodulator 2250 as shown in FIG. 4, the samples from filter 2252 is downconverted to baseband by multipliers 2254a and 2254b with the inphase and quadrature sinusoids from local oscillator 2260 and phase splitter 2258, respectively. By proper selection of the frequency of the samples from filter 2252, for the ΣΔ ADC, the frequency downconversion stage can be made trivial. The samples from the ΣΔ ADC are provided to filter 2252 which filters the IF samples and decimates by N to produce decimated samples at the decimated frequency $f_d$. If the decimated frequency $f_d$ is selected to be one quarter of the sampling frequency, or $f_d = f_s/4$, the quadrature downconversion by multipliers 2254a and 2254b can be performed by multiplying the decimated samples from filter 2252 with the sequences (1, 0, −1, 0, 1, 0, −1, . . . ) and (0, 1, 0, −1, 0, 1, 0, . . .), respectively. Thus multipliers 2254a and 2254b can be implemented with simple digital circuits.

In the exemplary embodiment, the subsampling ΣΔ receiver of the present invention in used to demodulate CDMA signals having a two-sided bandwidth of 1.2288 MHz. In the exemplary embodiment, the decimated frequency $f_d$ is selected to be chip×8 (9.83 MHz), or eight times the two-sided bandwidth of the CDMA signal, for ease implementing the quadrature downconversion stage and the subsequent signal processing stages. In the exemplary embodiment, the sampling frequency is selected to be 66.6 MHz and the center frequency of the IF signal into the ΣΔ ADC is 116.5 MHz, or $f_{IF} = 1.75 \cdot f_s$. These frequencies are selected to yield minimal undesired signals and intermodulation products in the signal band. Other sampling and IF frequencies can also be used and are within the scope of the present invention. The ratio of the sampling frequency over the decimated frequency is 6.77 (66.6 MHz/9.83 MHz) which is not an integer. In the exemplary embodiment, a data rate converter is used to resample the IF samples at $f_s$ into converted samples at a converted frequency $f_c$. The converted frequency $f_c$ is selected to be an integer multiple of the decimated frequency, or $f_c = M \cdot f_d$. The data rate converter can be implemented in a manner known in the art, such as a linear interpolator or a quadratic interpolator. In some applications wherein the frequency plan allows for sampling at a sampling frequency which is p times the decimated frequency $f_d$, where p is an integer, the data rate converter is not required.

The second major advantage of subsampling ΣΔ receivers is less stringent requirements on the analog filters. Within the front end of the subsampling ΣΔ receivers, only simple anti-alias filtering is necessary to remove undesired signals from the output signal from the first mixer (e.g. mixer 2220) before sampling by ΣΔ ADC. The stringent analog match filters which are required in receiver 2100 are implemented with digital filters within the digital signal processor.

Stringent analog filters may also be needed in receiver 2100 to suppress undesired signals. For CDMA application, undesired signals of large amplitude (e.g., comprising jammers) can be located very close to the band edge of the desired signal (e.g. the CDMA signal). The jammers can be much higher in amplitude than the desired signal. In the prior art, sharp analog filters are required to suppress the jammers to a smaller amplitude so that the ADCs are not clipped, since clipping of the ADCs causes intermodulation products which degrade the desired signal. The ΣΔ ADC in the present invention can be designed with additional bits of resolution which can be used to quantize the jammers without clipping the ΣΔ ADC. The additional bits enable the ΣΔ ADC to tolerate higher amplitude jammers, thereby relaxing the requirements of the analog filters before the ΣΔ ADC.

The third major advantage of the subsampling ΣΔ receiver is that quadrature demodulation of the IF samples from the ΣΔ ADC can be performed with the required precision and with improved reliability over the analog quadrature demodulation in the prior art. Referring to FIG. 4, filter 2252 and lowpass filters 2256a and 2256b can be designed to provide the required match filtering of the input signal which is typically required by a demodulator for optimal performance. Implementation of the filters with digital filters, such as finite impulse response (FIR) filters, infinite impulse response (IIR) filters, or polyphase filters, allows for high performance and increased reliability. The digital filters can also be designed to achieve the required precision while minimizing circuit complexity. Digital filters can also provide improved performance since the frequency response of the digital filters is identical for all units produced. Consistency is important for receivers which are produced in high quantity.

Digital demodulation also offers great flexibility and lower cost. The digital filters can be designed to meet any required specifications (e.g. any required frequency response). The digital filters can also be designed with the flexibility to provide the optimal frequency response based on the requirements of the application. For example, the FIR filters can be designed with filter tap coefficients which can be loaded from a controller. The frequency response of the FIR filters can then be dynamically varied for different operating modes. In addition, the digital filters can be designed in stages, and some stages can be bypassed when not required to minimize power consumption.

Digital quadrature demodulation can be implemented with digital circuits which can be integrated into one or few integrated circuits (ICs) to minimize component count, decrease cost, and improve reliability. In addition, digital circuits can be easily tested during the manufacturing phase and/or the operational phase. In the prior art, quadrature demodulation is implemented with analog circuits. Poor component tolerance in analog circuits can result in the receiver not meeting the required performance specifications. Also, analog circuits comprise many components which can degrade the reliability of the receiver and increase cost. In addition, the analog circuits of the prior art need to be redesigned for each of multiples standards, e.g., to meet the IS-95 standard, the Korean standard, and the Japanese standard.

The fourth major advantage of the subsampling ΣΔ receiver is the elimination of quadrature mismatch. In the present invention, because the signal processing after the ΣΔ ADC is performed digitally, the quadrature imbalance found in analog quadrature demodulator is eliminated. In the exemplary embodiment, multipliers 2254 and lowpass filters 2256 are designed to be identical. Furthermore, the inphase and quadrature sinusoids from local oscillator 2260 and phase shifter 2258, respectively, are generated from different values (e.g. 1, 0, or −1) associated with the same clock signal and have no phase error. For digital quadrature demodulator, the two signal paths are matched and in exact quadrature to one another.

In the analog quadrature demodulator of the prior art (see FIG. 1), two signal paths are used to process the baseband I and Q signals. Any mismatch in the two signal paths (e.g. error in phase splitter 2136 and/or mismatch in mixers 2128, lowpass filters 2130, and ADCs 2140) results in cross-talk of the I signal onto the Q signal, and vice versa. The cross-talk results in degradation of the BER performance of the analog quadrature demodulator.

The fifth major advantage of the subsampling ΣΔ receiver is that the ΣΔ ADC can be designed to provide improved dynamic range, linearity, and DC offset over that of the conventional (e.g. flash and successive approximation) ADCs used in the prior art. Noise shaping of the quantization noise by the ΣΔ ADC provides improved dynamic range over conventional ADCs since the amount of quantization noise in the signal band is reduced. For conventional ADCs, the quantization noise is white across the output spectrum from DC to the sampling frequency. For ΣΔ ADC, the quantization noise is minimal in the signal band through proper design of the noise shaper within the ΣΔ ADC. The noise shaper can be designed to match the characteristics of the IF signal and the performance requirements.

The improved dynamic range offered by the ΣΔ ADC also results from the high oversampling of the input signal. For a bandpass ΣΔ ADC, the oversampling ratio is defined as the sampling frequency divided by two times the two-sided bandwidth of the input signal or $OSR=f_s/2f_{bw}$. The output of the ΣΔ ADC can be 1-bit or m-bits, depending on whether a single-loop architecture or a MASH (Multi-stAge noise SHaper) architecture is used and whether a single-bit or a multi-bit quantizer is used. The sampling frequency is selected to be much higher than the signal bandwidth. Therefore, the quantization noise is spread over the a wider spectrum, from DC to the sampling frequency. Subsequent filtering and decimation of the samples from the ΣΔ ADC remove out-of-band noise while preserving the desired signal, thereby improving the dynamic range. An exemplary ΣΔ ADC design which provides for 12 bits of dynamic range is disclosed in detail in copending U.S. patent application Ser. No. 08/928,874.

In the exemplary embodiment, the ΣΔ ADC can have 12 or more bits of resolution. The resolution can be designed by proper selection of the oversampling ratio, the noise shaper, and the order of the ΣΔ ADC. The IF signal into the ΣΔ ADC typically comprises the desired signal plus undesired signals which can comprise jammers. The amplitude of the jammers can be much larger than the amplitude of the desired signal. To avoid clipping the ADC input, which can produce in-band intermodulation products, the IF signal is scaled to fit within the full-scale input of the ADC. As the amplitude of the jammers increases, the desired signal becomes a smaller percentage of the input IF signal. More bits of resolution is required from the ADC to adequately quantize the desired signal.

In the analog quadrature demodulator of the prior art, the amplitude of the jammers is minimized by filtering the analog signal with complex filters before sampling by the ADCs. Since the jammers can be located close to the signal band (e.g. 900 KHz away from the center frequency of the CDMA signal), sharp roll-off filters such as SAW filters and high order elliptical filters are required to minimize the amplitude of the jammers. These sharp roll-off filters can be complex to design, difficult to manufacture, and costly.

The additional number of bits of resolution provided by the ΣΔ ADC of the present invention corresponds to higher dynamic range and allows for jammers of larger amplitude in the IF signal without degradation of the desired signal. The higher resolution allows the ΣΔ ADC to properly quantize the desired signal even if it is only a small fraction of the input IF signal. In the exemplary embodiment, only four bits of resolution are required for proper demodulation of the desired signal. Using a 12-bit ΣΔ ADC, the remaining eight bits can be used to handle jammers and/or to provide gain control.

The ΣΔ ADC of the present invention also provides improved linearity and DC offset characteristics over the conventional ADCs of the prior art. For the flash ADC of the prior art, linearity is dependent on the matching of the resistors in the two resistive ladders used to divide the input signal and the reference voltage, as described above. The number of resistors in a ladder is $2^m$, where m in the number of bits in the ADC. As m increases, linearity is more difficult to maintain because of the number of resistors which need to be matched. In contrast, for ΣΔ ADC, linearity is more easily achieved because a single-bit quantizer can be used. As long as the high and low feedback voltages within the ΣΔ ADC are maintained at a constant level, linearity is maintained.

Non-linearity can degrade the performance of the receiver, such as the bit-error-rate (BER) or the frame-error-rate (FER). Non-linearity can also degrade the performance of the multiple loops within the receiver, such as the carrier-tracking loop and the bit-timing loop. The carrier-tracking-loop tracks the frequency/phase of the input RF signal and bit-timing-loop tracks the symbol rate of the input signal. Non-linearity can also affect the measurement of the signal level which is used in the automatic gain control (AGC) circuit and the bias control circuit used to improve the input-referred third order intermodulation product (IIP3) performance.

The ΣΔ ADC also has improved DC offset characteristics over the conventional ADC of the prior art. For baseband ΣΔ ADC, DC offset is improved because the analog filters of the prior art that amplifies DC is no longer present in the present invention. For bandpass ΣΔ ADC, DC offset is not a concern because this spectral component is out-of-band. Any DC offset can be filtered out and contributes little to the output samples.

DC offset is particularly important for digital communication system since this parameter can degrade the BER performance and the performance of the phase locked loops within the receiver. DC offset skews the quantization of the ADC output samples and can result in erroneous detection of the input signal. DC offset can also degrade the performance of the Viterbi decoding process, which is commonly used in digital communication systems. In addition, DC offset affects the performance of the carrier-tracking and bit-timing loops. DC offset introduces a DC bias into the loops which degrades the acquisition performance of the loops. The DC bias also stresses the loops, thereby degrading the tracking performance of the loops. In many communication system, DC offset is an important design and manufacturing consideration which is addressed by one or a combination of measures. The DC offset of each ADC can be carefully screened to specified limits. Also, special compensation loops can be designed to estimate and track out the DC offset of each ADC.

The design of the ΣΔ ADC as described in copending U.S. patent application Ser. No. 08/928,874, provides additional benefits when used within the receiver of the present invention. The ΣΔ ADC can be reconfigured during operation such that portions of the ΣΔ ADC can be turned OFF to conserve power when high performance is not required. For example, the ΣΔ ADC can be implemented as a two-loop MASH architecture and one loop can be turned OFF when high dynamic range is not required.

Another benefit provided by the ΣΔ ADC is the ease of interface between the ΣΔ ADC and other circuitry within the receiver. The ΣΔ ADC only outputs one or few bits at each sampling clock cycle even though the ΣΔ ADC may have more bits of resolution. Thus, the ΣΔ ADC has few input/ output (I/O) pins. Furthermore, only one ΣΔ ADC is required for subsampling ΣΔ receivers. Fewer ADC and I/O pins simplify the routing between the ΣΔ ADC and other circuits within the receiver. For conventional ADCs, one I/O pin is typically required for each bit of resolution. Furthermore, two conventional ADCs are required for a quadrature demodulator as shown in FIG. 1. The high number of ADCs and I/O pins can make the layout and routing more difficult.

Receivers 2200 and 2300 are two exemplary receiver architectures which support subsampling ΣΔ analog-to-digital conversion of the IF signal. Other receiver architectures can be design to provide the necessary front end processing based on the requirements of the application for which the receiver is used. Furthermore, other digital signal processors can be designed to perform demodulation of the IF samples. Thus, different receiver architectures which comprise a subsampling ΣΔ ADC are within the scope of the present invention.

II. Nyquist Sampling ΣΔ Receiver

In the first embodiment of the present invention, the receiver comprises a subsampling ΣΔ ADC. This architecture provides many benefits as described above. In the second embodiment of the present invention, the receiver comprises a Nyquist sampling ΣΔ ADC. This architecture provides many of the benefits of the ΣΔ ADC, specifically high dynamic range, improved linearity, low DC offset, and minimal power consumption. For Nyquist sampling ADC, the sampling frequency is at least twice the highest frequency of the input signal into the ADC so that aliasing is avoided rather than utilized.

Figure 6:
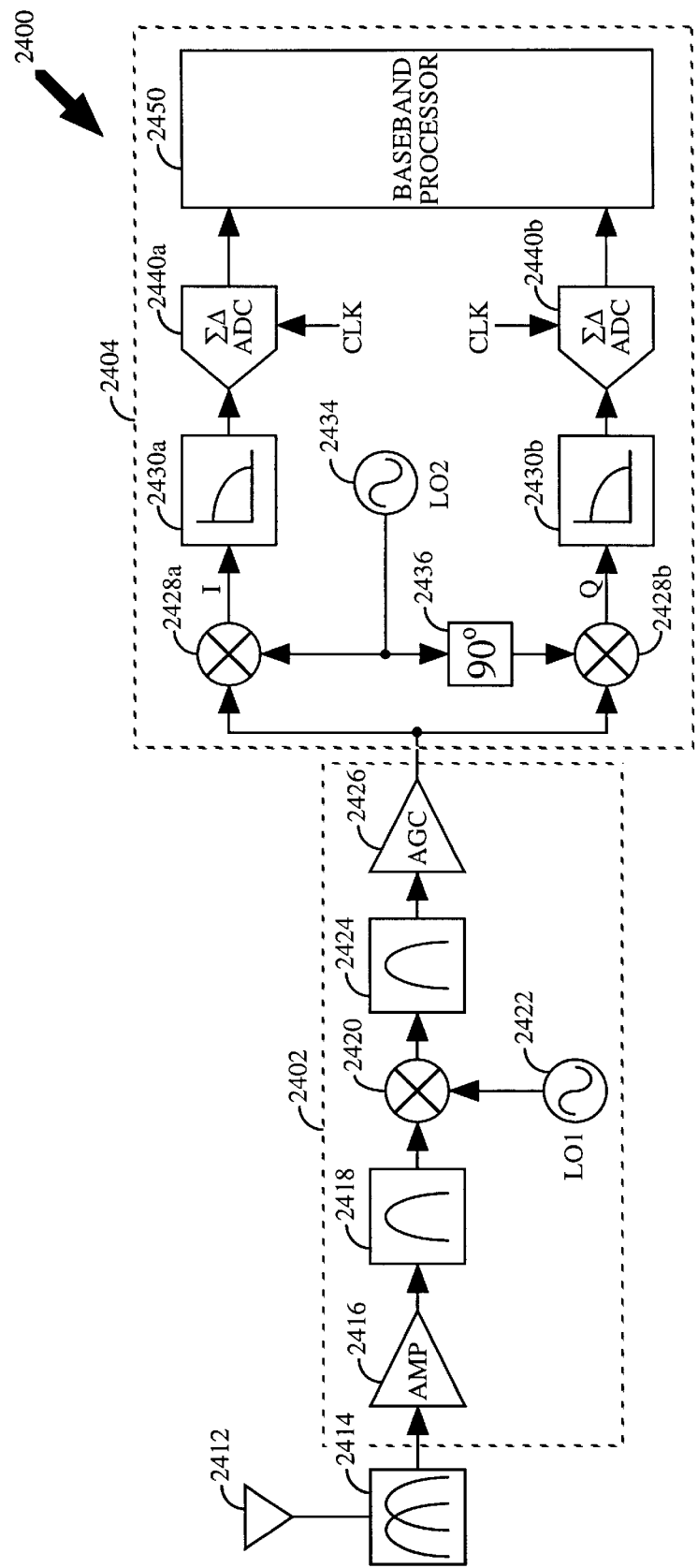
FIG. 6 is a block diagram of an exemplary Nyquist sampling baseband ΣΔ receiver of the present invention.

A block diagram of an exemplary Nyquist sampling ΣΔ receiver used for quadrature demodulation is illustrated in FIG. 6. Receiver 2400 can be used to demodulate BPSK, QPSK, OQPSK, QAM, and digital and analog modulation formats. Within receiver 2400, the transmitted signal is received by antenna 2412, routed through duplexer 2414, and provided to front end 2402. Within front end 2402, amplifier (AMP) 2416 amplifies the signal and provides the amplified signal to bandpass filter 2418 which filters the signal to remove undesired signals. In the exemplary embodiment, bandpass filter 2418 is a surface acoustic wave (SAW) filter. The filtered signal is provided to mixer 2420 which downconverts the signal with the sinusoid from local oscillator (LO1) 2422. The IF signal from mixer 2420 is filtered by bandpass filter 2424 and amplified by automatic gain control (AGC) amplifier 2426 to produce the required signal amplitude at the input of ΣΔ ADCs 2440. In the exemplary embodiment, bandpass filter 2424 is also a SAW filter. The AGCed signal is provided to demodulator 2404.

Demodulator 2404 provides quadrature demodulation utilizing Nyquist sampling baseband ΣΔ ADCs. Within demodulator 2404, two mixers 2428a and 2428b downconvert the signal into the baseband I and Q signals with the sinusoid provided by local oscillator (LO2) 2434 and phase shifter 2436, respectively. The baseband I and Q signals are provided to lowpass filters 2430a and 2430b, respectively, which provide match filtering and/or anti-alias filtering of the baseband signals. The filtered signals are provided to ΣΔ ADCs 2440a and 2440b which sample the signals to produce the digitized baseband samples. The samples are provided to baseband processor 2450 for further processing (e.g. error detection and/or correction, decompression).

In the exemplary embodiment, ΣΔ ADCs 2440 are Nyquist sampling baseband ΣΔ ADC which can be implemented in the manner disclosed in copending U.S. patent application Ser. No. 08/928,874. The baseband ΣΔ ADC pushes the quantization noise around DC to higher frequency where filtering is more easily performed.

Nyquist sampling ΣΔ receiver can be designed to perform digital quadrature demodulation similar to subsampling ΣΔ receivers 2200 and 2300. In this embodiment, subsampling ΣΔ receivers 2200 and 2300 are designed such that the center frequency of the IF signal into the bandpass ΣΔ ADC is at an IF frequency. Preferably, the IF frequency is selected to be $0.25 \cdot f_s$. This IF frequency can be obtained by adjusting the frequency of the first local oscillator (e.g. LO1 2222) or by a second frequency downconversion stage interposed between the first frequency downconversion stage (e.g. mixer 2200) and the bandpass ΣΔ ADC.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. A receiver for demodulating an RF signal comprising:
   a front end stage configured to receive and downconvert said RF signal to an intermediate (IF) signal, said IF signal having a center frequency and a two-sided bandwidth;
   a sigma-delta analog-to-digital converter coupled to said front end stage, said ΣΔ ADC configured to receive and sample said IF signal to provide IF samples, said ΣΔ ADC being clocked at a sampling frequency; and
   a digital signal processor coupled to said ΣΔ ADC, said digital signal processor configured to receive and demodulate said IF samples in accordance with a modulation format used to produce said RF signal.

2. The receiver of claim 1 wherein said digital signal processor comprises:
   a digital filter configured to receive and filter said IF samples to provide filtered samples, said digital filter further configured to decimate said filtered samples by a decimation ratio.

3. The receiver of claim 2 wherein said digital signal processor further comprises:
   a demodulator coupled to said digital filter, said demodulator configured to receive and downconvert said filtered samples to provide inphase samples and quadrature samples.

4. The receiver of claims 3 wherein said digital signal processor further comprises:
   two digital lowpass filters coupled to said demodulator, one lowpass filter configured to receive and filter said inphase samples and the other lowpass filter configured to receive and filter said quadrature samples.

5. The receiver of claim 4 wherein said lowpass filters perform matched filtering of said inphase and quadrature samples.

6. The receiver of claim 2 wherein a frequency response of said digital filter can be adjusted based on an operating mode of said receiver.

7. The receiver of claim 6 wherein said sampling frequency is selected based on said decimation ratio of said digital filter and said two-sided bandwidth of said IF signal.

8. The receiver of claim 1 wherein said ΣΔ ADC is a subsampling bandpass ΣΔ ADC.

9. The receiver of claim 8 wherein said center frequency of said IF signal is approximately $0.25 \cdot (2n+1)$ times said sampling frequency where n is an integer greater than one.

10. The receiver of claim 9 wherein n is equal to two.

11. The receiver of claim 8 wherein said center frequency of said IF signal is 0.25·(2n) times said sampling frequency, where n is an integer greater than one.

12. The receiver of claim 11 wherein n is equal to two.

13. The receiver of claim 1 wherein said IF signal comprises a CDMA signal.

14. The receiver of claim 13 wherein said center frequency of said IF signal is approximately 116.5 MHz.

15. The receiver of claim 14 wherein said sampling frequency is approximately 66.6 MHz.

16. The receiver of claim 13 wherein said two-sided bandwidth is approximately 1.23 MHz.

17. The receiver of claim 1 wherein said ΣΔ ADC comprises multiple loops, wherein each loop can be selectively turned ON or OFF depending on a specified requirement.

18. The receiver of claim 17 wherein said specified requirement is a required dynamic range.

19. The receiver of claim 1 wherein said ΣΔ ADC is a MASH ΣΔ ADC.

20. The receiver of claim 19 wherein said MASH ΣΔ ADC is a MASH 4-4 ΣΔ ADC.

21. The receiver of claim 1 wherein said ΣΔ ADC is a multi-sampling ΣΔ ADC.

22. The receiver of claim 21 wherein said ΣΔ ADC is a double-sampling ΣΔ ADC.

23. The receiver of claim 1 wherein said ΣΔ ADC is a subsampling baseband ΣΔ ADC.

24. The receiver of claim 1 wherein said ΣΔ ADC is a Nyquist sampling bandpass ΣΔ ADC.

25. The receiver of claim 1 wherein said ΣΔ ADC is a Nyquist sampling baseband ΣΔ ADC.

26. The receiver of claim 1 wherein said sampling frequency is selected based on said two-sided bandwidth of said IF signal.

27. The receiver of claim 1 wherein said ΣΔ ADC provides four or more bits of resolution.

28. The receiver of claim 1 wherein said ΣΔ ADC is clocked at an oversampling ratio of sixteen or greater.

29. The receiver of claim 1 wherein said ΣΔ ADC is a single-loop ΣΔ ADC.

30. The receiver of claim 1 wherein modulation format is quadrature phase shift keying (QPSK).

31. The receiver of claim 1 wherein modulation format is offset quadrature phase shift keying (OQPSK).

32. The receiver of claim 1 wherein modulation format is m-ary phase shift keying (m-PSK).

33. A receiver for demodulating an RF signal comprising:

a front end stage configured to receive and downconvert said RF signal to an intermediate (IF) signal;

a quadrature demodulator coupled to said front end stage, said quadrature demodulator configured to receive and downconvert said IF signal into baseband I and Q signals; and two ΣΔ ADCs coupled to said quadrature demodulator, one ΣΔ ADC configured to receive said baseband I signal and one ΣΔ ADC configured to receive said baseband Q signal, said ΣΔ ADCs independently sampling said baseband I and Q signals to produce baseband samples, said ΣΔ ADC being clocked at a sampling frequency.

34. The receiver of claim 33 wherein said ΣΔ ADCs are MASH ΣΔ ADC.

35. The receiver of claim 34 wherein said ΣΔ ADCs are MASH 4-4 ΣΔ ADC.

36. The receiver of claim 33 wherein said ΣΔ ADCs are Nyquist sampling baseband ΣΔ ADCs.

37. The receiver of claim 33 further comprising:

two filters coupled between said quadrature demodulator and said ΣΔ ADCs, each filter configured to receive and filter a respective baseband signal to provide a filtered signal, wherein each ΣΔ ADC independently samples a respective filtered signal to provide baseband samples.

38. The receiver of claim 33 wherein said ΣΔ ADCs are a multi-sampling ΣΔ ADCs.

* * * * *